US012765057B2

(12) United States Patent
Jeong et al.

(10) Patent No.: US 12,765,057 B2
(45) Date of Patent: Oct. 13, 2026

(54) THIN-FILM TRANSISTOR HAVING METAL OXIDE SEMICONDUCTOR LAYERS OF HETEROJUNCTION STRUCTURE, DISPLAY DEVICE COMPRISING SAME, AND MANUFACTURING METHOD THEREFOR

(71) Applicant: IUCF-HYU (INDUSTRY-UNIVERSITY COOPERATION FOUNDATION HANYANG UNIVERSITY), Seoul (KR)

(72) Inventors: Jae Kyeong Jeong, Seoul (KR); Hyeon Joo Seul, Incheon (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 574 days.

(21) Appl. No.: 18/005,283

(22) PCT Filed: Jun. 23, 2021

(86) PCT No.: PCT/KR2021/007882
§ 371 (c)(1),
(2) Date: Jan. 12, 2023

(87) PCT Pub. No.: WO2022/025439
PCT Pub. Date: Feb. 3, 2022

(65) Prior Publication Data

US 2023/0253504 A1 Aug. 10, 2023

(30) Foreign Application Priority Data

Jul. 27, 2020 (KR) ........................ 10-2020-0092972

(51) Int. Cl.
*H10D 86/40* (2025.01)
*H10D 30/01* (2025.01)
*H10D 30/67* (2025.01)

(52) U.S. Cl.
CPC ....... *H10D 86/423* (2025.01); *H10D 30/0321* (2025.01); *H10D 30/6729* (2025.01); *H10D 30/6755* (2025.01)

(58) Field of Classification Search
CPC .... H10D 86/423; H10D 86/60; H10D 30/031; H10D 30/0312; H10D 30/0316;
(Continued)

(56) References Cited

U.S. PATENT DOCUMENTS 9,171,960 B2 * 10/2015 Hong ................. H10D 30/0321
2012/0286871 A1 * 11/2012 Ohnuki .................. H10D 86/60
330/261
(Continued)

FOREIGN PATENT DOCUMENTS

KR 10-2000-0050263 A 8/2000
KR 10-1004736 B1 1/2011
(Continued)

OTHER PUBLICATIONS

International Search report of PCT/KR2021/007882 dated Oct. 5, 2021 [PCT/ISA/210].
(Continued)

*Primary Examiner* — Natalia A Gondarenko
(74) *Attorney, Agent, or Firm* — Sughrue Mion, PLLC

(57) ABSTRACT

A thin-film transistor comprises a substrate; an insulating layer formed on the substrate; an active layer formed on the insulating layer; and source and drain electrode layers formed on the active layer so as to be spaced from each other, wherein the active layer comprises: a first oxide semiconductor layer consisting of In, Ga and O; and a
(Continued)

second oxide semiconductor layer which is formed on the first oxide semiconductor layer and which consists of Zn and O.

The thin-film transistor having metal oxide semiconductor layers of a heterojunction structure has greatly improved electron mobility by comprising, as an active layer, oxide semiconductor layers of a heterojunction structure. In addition, the physical properties of a thin-film transistor to be manufactured can be controlled by adjusting the composition and thickness of oxide semiconductor layers through an atomic layer deposition (ALD) process.

8 Claims, 15 Drawing Sheets

(58) Field of Classification Search

CPC ........... H10D 30/0321; H10D 30/6713; H10D 30/6725; H10D 30/6729; H10D 30/6732; H10D 30/675; H10D 30/6755; H10D 62/80; H10D 62/82; H10D 62/8271; H10D 62/86; H10D 62/875; H10D 99/00; H10D 64/257; G02F 1/1368; H01L 21/02; H01L 21/02565; H01L 21/0262; H10K 59/1213; H10P 95/00; H10P 14/24; H10P 14/3434; H10P 14/6339

USPC ........................................................... 257/59

See application file for complete search history.

(56) References Cited

U.S. PATENT DOCUMENTS

| | | | | |
|---|---|---|---|---|
| 2013/0009219 | A1* | 1/2013 | Yamazaki | H10D 30/6756 257/E21.409 |
| 2016/0247934 | A1* | 8/2016 | Hanaoka | H10D 30/6729 |
| 2019/0172954 | A1* | 6/2019 | Zhou | H10K 50/86 |
| 2020/0176603 | A1* | 6/2020 | Baeck | H10D 30/6746 |
| 2021/0151569 | A1* | 5/2021 | Yamazaki | H10D 62/126 |
| 2021/0376089 | A1* | 12/2021 | Vellianitis | H10D 62/86 |

FOREIGN PATENT DOCUMENTS

| | | | |
|---|---|---|---|
| KR | 10-2016-0102363 | A | 8/2016 |
| KR | 10-2018-0101754 | A | 9/2018 |
| KR | 10-2018-0125100 | A | 11/2018 |
| KR | 10-2080482 | B1 | 2/2020 |
| KR | 10-2020-0076343 | A | 6/2020 |

OTHER PUBLICATIONS

Hyeon Joo Seul et al., "Atomic Layer Deposition Process-Enabled Carrier Mobility Boosting in Field-Effect Transistors through a Nanoscale ZnO/IGO Heterojunction", Applied Materials & Interfaces, 2020, vol. 12, pp. 33887-33898.

* cited by examiner

【FIG. 4】
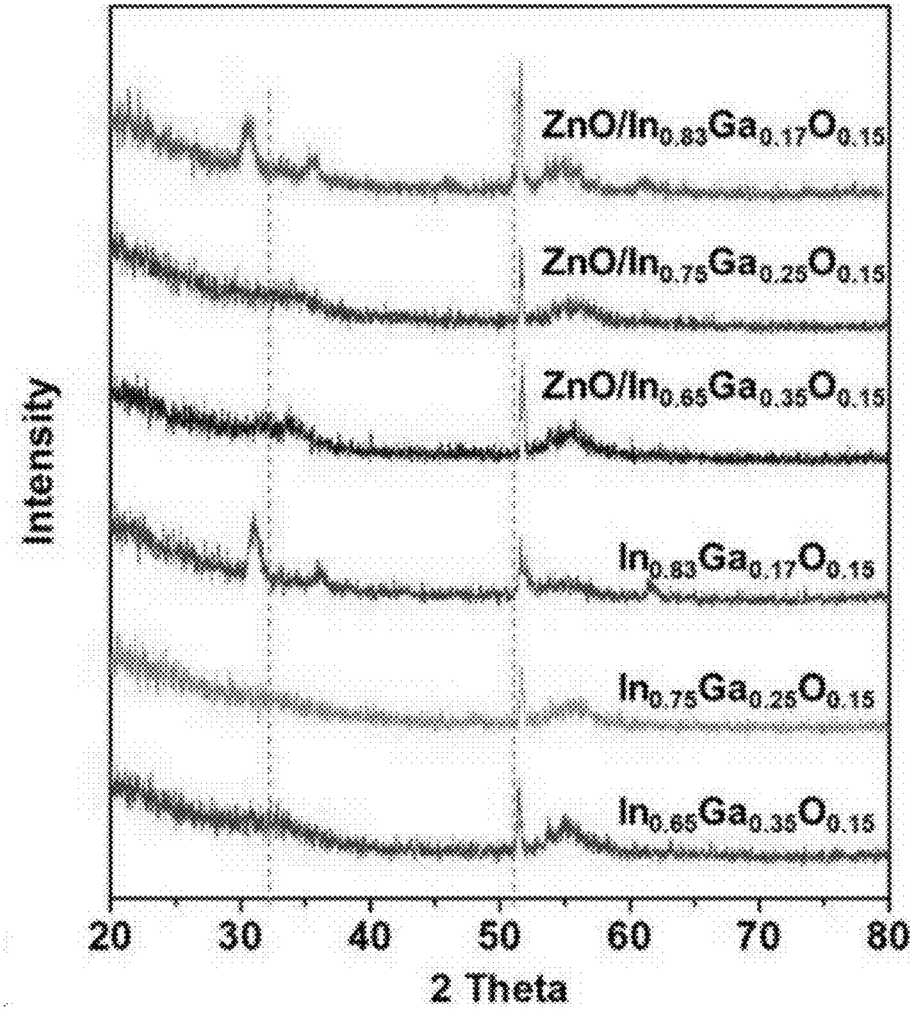

【FIG. 5】
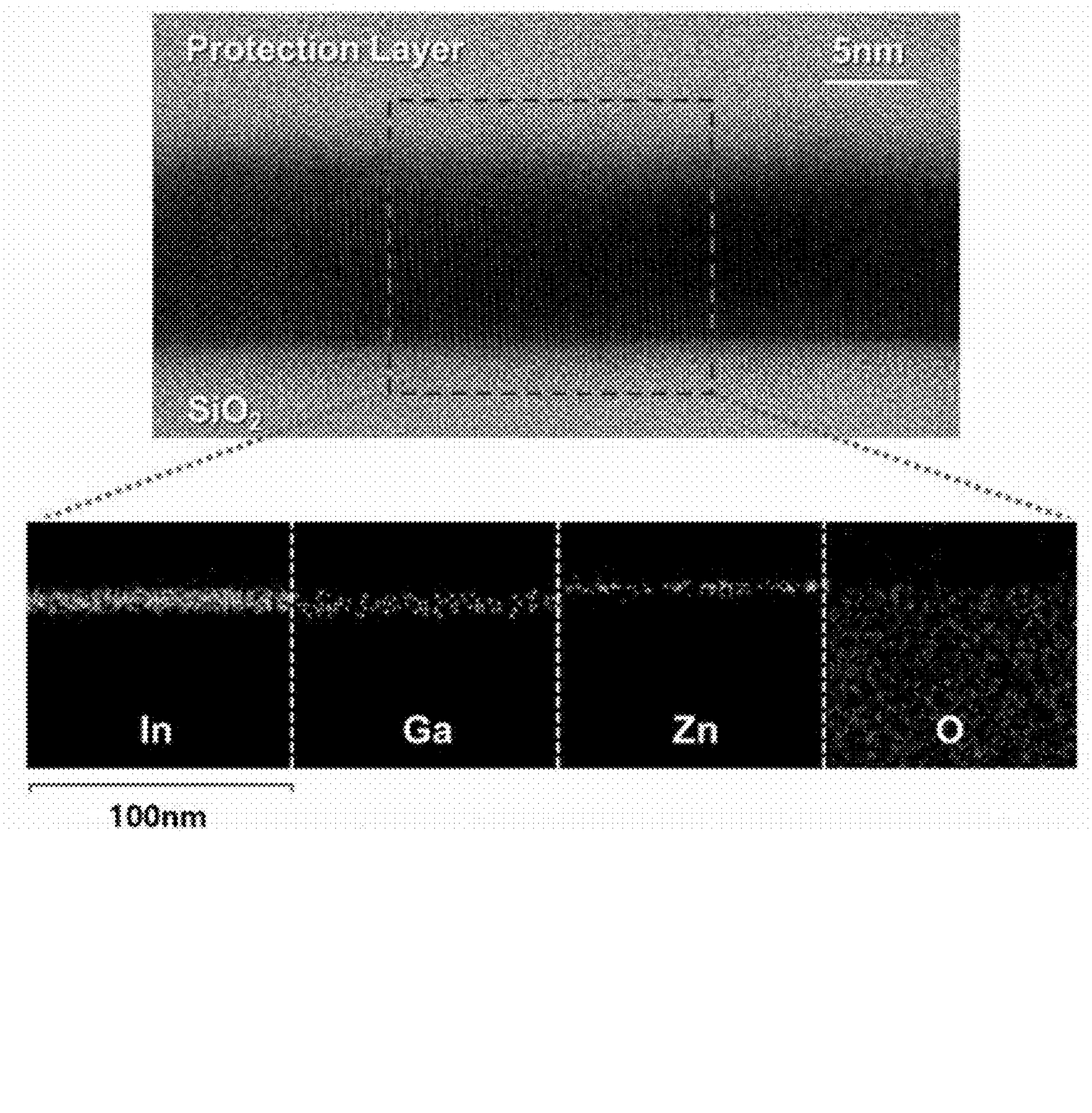

【FIG. 6 A】
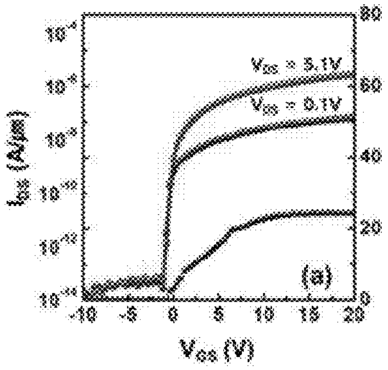
【FIG. 6 B】
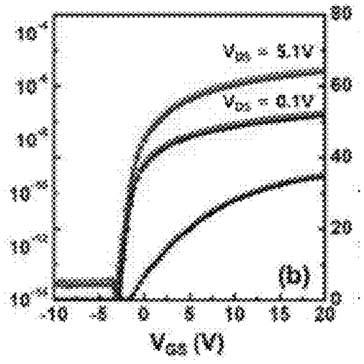
【FIG. 6 C】
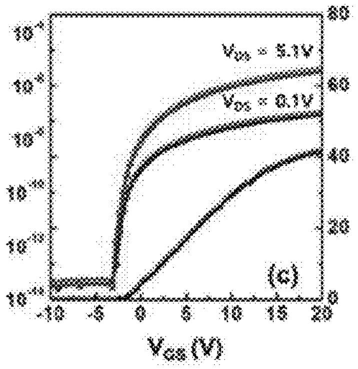

【FIG. 6 D】
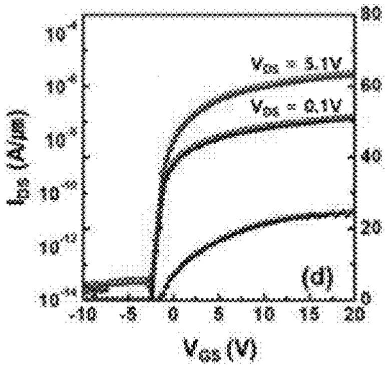
【FIG. 6 E】
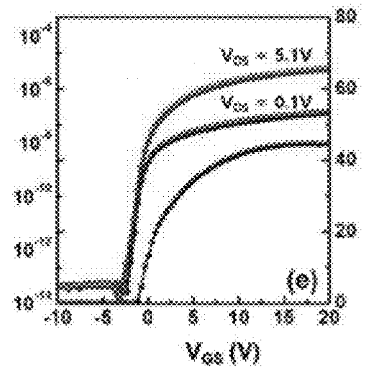
【FIG. 6 F】
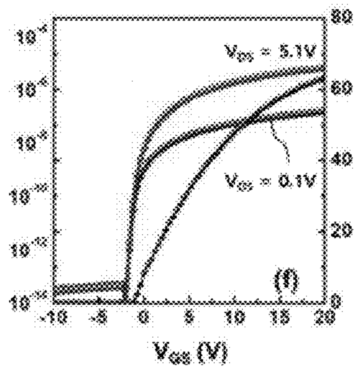

【FIG. 11A】
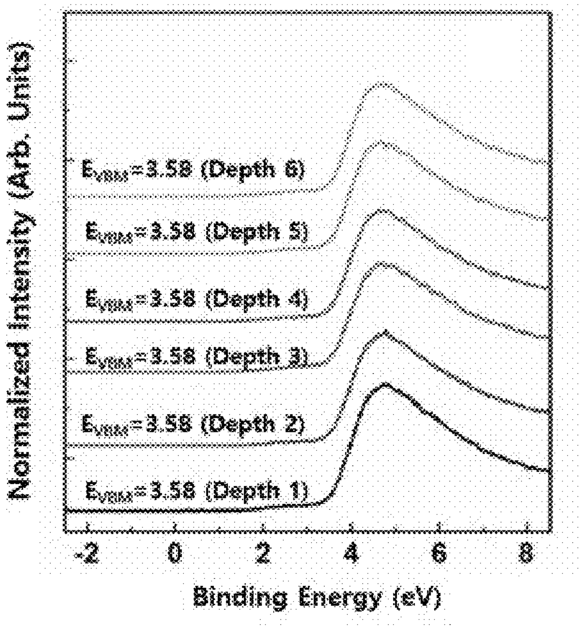
【FIG. 11B】
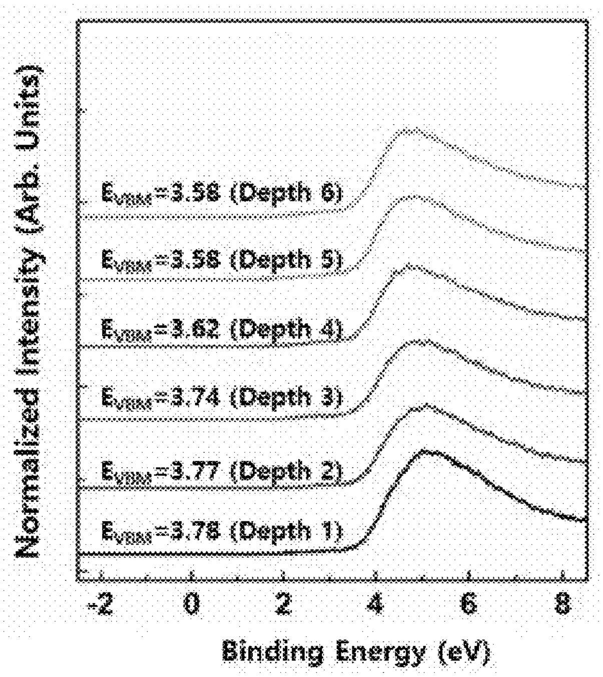

【FIG. 12】
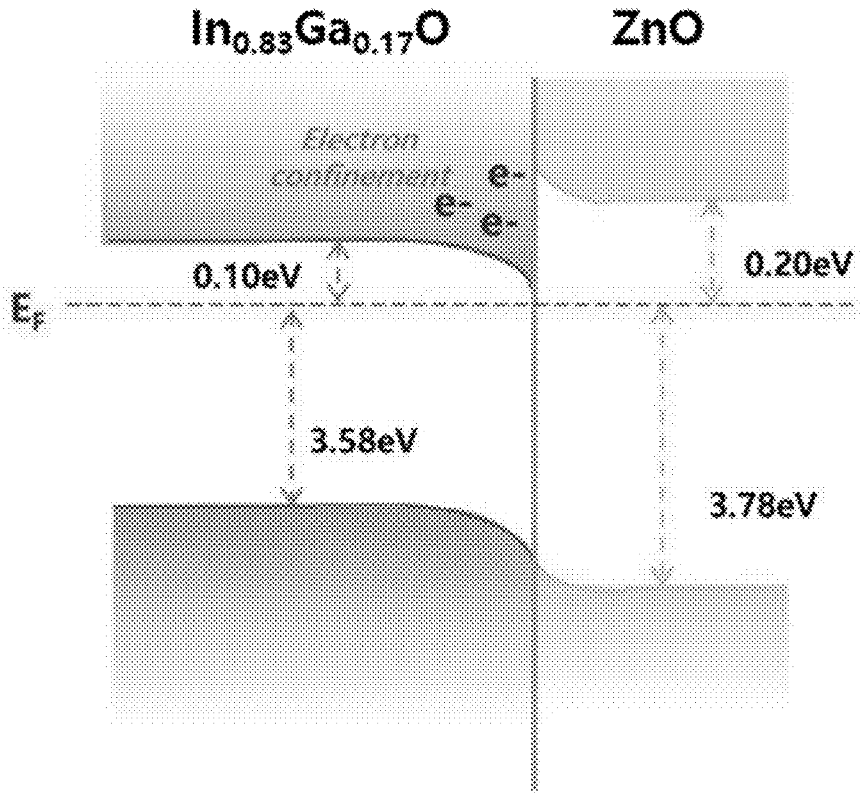

【FIG. 13A】
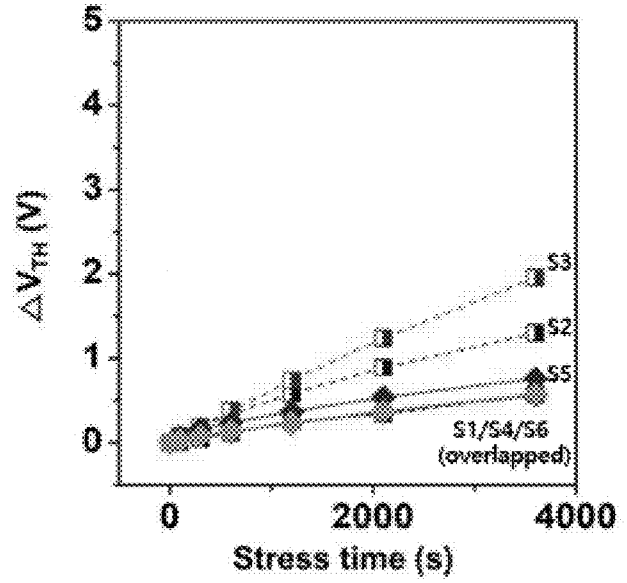
【FIG. 13B】
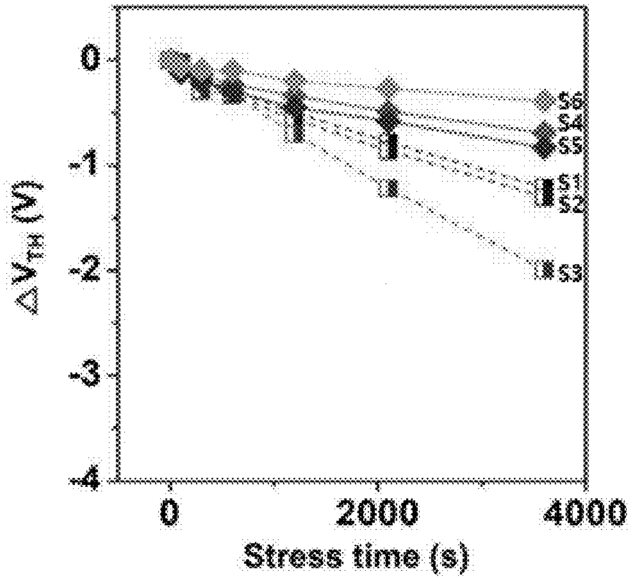

THIN-FILM TRANSISTOR HAVING METAL OXIDE SEMICONDUCTOR LAYERS OF HETEROJUNCTION STRUCTURE, DISPLAY DEVICE COMPRISING SAME, AND MANUFACTURING METHOD THEREFOR

CROSS REFERENCE TO RELATED APPLICATIONS

This application is a National Stage of International Application No. PCT/KR2021/007882 filed Jun. 23, 2021, claiming priority based on Korean Patent Application No. 10-2020-0092972 filed Jul. 27, 2020.

TECHNICAL FIELD

The present invention relates to a thin film transistor including a metal oxide semiconductor layer with a heterojunction structure, a display device comprising the thin film transistor, and a method for manufacturing the thin film transistor, and more particularly, to a thin film transistor including a metal oxide semiconductor layer with a heterojunction structure in which an indium gallium zinc oxide (IGZO)-based semiconductor layer forms a heterojunction structure so that electron mobility is considerably improved, a display device comprising the thin film transistor, and a method for manufacturing the thin film transistor using an atomic layer deposition (ALD) process.

BACKGROUND ART

In the field of logic and memory semiconductor devices, performance improvement has been sought through scaling, but since the continuous introduction of new materials and processes and the development of device types are essential, the traditional two-dimensional scaling of silicon (Si) semiconductors has recently faced fundamental physical limitations.

In particular, in a scale of 100 nm or less, due to miniaturization, high density, and high integration of circuit patterns and the increase in number of line layers, process integration becomes very complicated, and the number of process operations continues to increase.

As an example of process development for device miniaturization, in lithography technology, resolution has been improved by reducing a wavelength of a light source. In order to form a pattern smaller than a wavelength, various resolution enhancement technologies have been developed and used but are expected to soon face limitations.

Scaling through material development is represented by introduction of a new high-k gate dielectric and a metal gate, adoption of channel and S/D junction strain technology using SiGe or SiC, or the like. From a scale of 10 nm or less, it is expected that new channel materials with high charge mobility, such as Ge, III-V, nanowires, and graphene, will be used.

Thin film transistors (TFT) are used as switches and drivers for display devices and new augmented reality (Ar)/virtual reality (VR) devices. In particular, due to high mobility, excellent uniformity, and very low leakage current characteristics, multi-component indium gallium zinc oxide (IGZO) semiconductors have been introduced as active matrix materials for high pixel density and low power screens. In addition, the application of IGZO to large-scale integration (LSI) devices including static random access memories (SRAMs), dynamic random access memories (DRAMs), central processing units (CPUs), and complementary metal-oxide semiconductor (CMOS) image sensors is being researched. To this end, a channel of an IGZO transistor is scaled down to a channel having a length of about 30 nm.

As compared with epitaxial Si or SiGe, IGZO has advantages such as a considerably low leakage current ($10^{-24}$ A/μm) due to a wide band gap (~3.2 eV) and low-temperature processing capability (~400° C.). IGZO is suitable for upper layer transistors for accessing a logic, a memory, or a photosensor for monolithic three-dimensional (3D) integrated devices and systems. However, IGZO semiconductors have a problem of low mobility as compared with other channel candidates such as carbon nanotubes and two-dimensional (2D) $MoS_2$ in an upper layer transistor of a Si-CMOS substrate.

Meanwhile, as a standard path for depositing an IGZO channel layer for a display device, sputtering technology has been intensively researched. Sputtering is useful on an $8^{th}$ generation glass substrate (having a size of 2,200 $mm^2$×2,400 $mm^2$) due to fast deposition, large area scalability, and excellent productivity. However, sputtering does not allow film adaptability to nano-trench structures or controllability in a cation composition of several nano-thick IGZO films.

As an alternative to sputtering, atomic layer deposition (ALD) has been proposed as an alternative to physical vapor deposition because ALD provides precise thickness control and excellent step coverage in complex 3D nanoscale structures due to a chemical self-limiting growth behavior. Accordingly, an attempt has been made to deposit a semiconducting metal oxide film using ALD so as to evaluate the performance of manufactured transistors. However, obtained field effect mobility is still inferior to that obtained from carbon nanotubes or 2D $MoS_2$.

Therefore, there is a need for a new strategy for improving carrier mobility in metal oxide transistors for monolithic 3D integrated systems.

RELATED ART DOCUMENTS (Patent Document 1) Korean Patent Registration No. 10-1004736 (2011 Jan. 4)

(Patent Document 2) Korean Patent Registration No. 10-2080482 (2011 Feb. 18)

DISCLOSURE

Technical Problem

An object of the present invention is to provide a thin film transistor comprising an indium gallium zinc oxide (IGZO)-based metal oxide semiconductor layer with a heterojunction structure in which electron mobility is considerably improved.

Another object of the present invention is to provide a method for manufacturing a thin film transistor comprising a metal oxide semiconductor layer with a heterojunction structure using an atomic layer deposition (ALD) process.

Still another object of the present invention is to provide a display device comprising the thin film transistor.

Technical Solution

In order to achieve the above objects, the present invention provides a thin film transistor comprising a substrate, an insulating layer formed on the substrate, an active layer formed on the insulating layer, and a source electrode layer and a drain electrode layer which are formed to be spaced apart from each other on the active layer, wherein the active layer comprises a first oxide semiconductor layer consisting of indium (In), gallium (Ga), and oxygen (O), and a second oxide semiconductor layer formed on the first oxide semiconductor layer and consisting of zinc (Zn) and O.

In the present invention, the first oxide semiconductor layer may be represented by $In_{1-x}Ga_xO_{1.5}$, and x may be 0.3 or less.

Preferably, the second oxide semiconductor layer may have a thickness of 5 nm or less.

The thin film transistor may have an electron mobility of 60 $cm^2/Vs$ or more.

The present invention also provides a method for manufacturing a thin film transistor comprising: providing a substrate; forming an insulating layer on the substrate, forming a first oxide semiconductor layer consisting of indium (In), gallium (Ga), and oxygen (O) on the insulating layer; forming a second oxide semiconductor layer consisting of zinc (Zn) and O on the first oxide semiconductor layer; and forming a source electrode and a drain electrode to be spaced apart from each other on the second oxide semiconductor layer.

In the present invention, preferably, at least one of the first and second oxide semiconductors may be formed through atomic layer deposition (ALD).

In the present invention, preferably, a temperature of the substrate may be maintained in a range of 200° C. to 300° C. during the process of the ALD.

In the present invention, the method may further comprise the step of performing post-processing at a temperature of 300° C. to 500° C. after the process of the ALD.

The present invention also provides a display device comprising the thin film transistor.

Advantageous Effects

In a thin film transistor including an indium gallium zinc oxide (IGZO)-based metal oxide semiconductor layer with a heterojunction structure according to the present invention, in order to overcome a limitation in low electron mobility of a conventional thin film transistor including an IGZO-based semiconductor layer as an active layer, an oxide semiconductor layer having a heterojunction structure is provided as an active layer, thereby providing a heterogeneous thin film transistor in which electron mobility is considerably improved.

In addition, a composition and thickness of an oxide semiconductor layer can be adjusted using an atomic layer deposition (ALD) process to control physical properties of a thin film transistor.

DESCRIPTION OF DRAWINGS

FIG. 3 shows atomic force microscope (AFM) topographic images of indium gallium oxide (IGO) and ZnO/IGO films with different indium (In) fractions according to one embodiment of the present invention, wherein

FIG. 4 shows X-ray diffraction (XRD) patterns of IGO and ZnO/IGO films with different In fractions according to one embodiment of the present invention.

FIG. 5 shows an energy dispersive spectroscopy (EDS) composition mapping image and a scanning transmission electron microscope (STEM) image of a ZnO/IGO stack layer according to one embodiment of the present invention.

FIG. 6 shows graphs of analyzing transmission characteristics of transistors including an IGO single channel layer and a ZnO/IGO heterojunction channel layer. FIG. 6A is an image for $In_{0.65}Ga_{0.35}O_{1.5}$, FIG. 6B is an image for $In_{0.75}Ga_{0.25}O_{1.5}$, FIG. 6C is an image for $In_{0.83}Ga_{0.17}O_{1.5}$, FIG. 6D is an image for $ZnO/In_{0.65}Ga_{0.35}O_{1.5}$, FIG. 6E is an image for $ZnO/In_{0.75}Ga_{0.25}O_{1.5}$, and FIG. 6F is an image for $ZnO/In_{0.83}Ga_{0.17}O_{1.5}$.

FIG. 11 shows results of analyzing ultraviolet photoelectron spectroscopy (UPS) depth profile of an $In_{0.83}Ga_{0.17}O_{1.5}$ single layer film and a $ZnO/In_{0.83}Ga_{0.17}O_{1.5}$ heterojunction layer film, wherein FIG. 11A shows a valance band (VB) spectrum according to a depth of the $In_{0.83}Ga_{0.17}O_{1.5}$ single layer film, and FIG. 11B shows a VB spectrum according to a depth of the $ZnO/In_{0.83}Ga_{0.17}O_{1.5}$ heterojunction layer film.

FIG. 12 is a diagram in which information about a VB edge change according to a depth is shown in an energy band diagram of a $ZnO/In_{0.83}Ga_{0.17}O_{1.5}$ heterojunction stack together with $E_g$ values.

FIG. 13A shows a graph showing a change in $V_{TH}$ shift in $I_{DS}$-$V_{GS}$ transmission characteristics of a transistor with IGO and FIG. 13B shows a graph showing a change in $V_{TH}$ shift in $I_{DS}$-$V_{GS}$ transmission characteristics of a transistor with ZnO/IGO heterojunction channels under positive gate bias stress (PBS) and negative gate bias stress (NBS) conditions (up to 3,600 sec) in a stress function.

MODES OF THE INVENTION

Unless otherwise defined, all technical and scientific terms used herein have the same meanings as those typically understood by those skilled in the art to which the present invention belongs. Generally, the nomenclature used herein is well known in the art and is typical.

The present invention relates to a thin film transistor including a substrate, an insulating layer formed on the substrate, an active layer formed on the insulating layer, and a source electrode layer and a drain electrode layer which are formed to be spaced apart from each other on the active layer, wherein the active layer comprises a first oxide semiconductor layer consisting of indium (In), gallium (Ga), and oxygen (O), and a second oxide semiconductor layer formed on the first oxide semiconductor layer and consisting of zinc (Zn) and O.

A thin film transistor (TFT) is used as a circuit for independently driving each pixel in a liquid crystal display (LCD) or an organic electro luminescence (EL) display device. Such a TFT is formed along with a gate line and a data line on a lower substrate of a display device. That is, the TFT includes a gate electrode which is a portion of the gate line, an active layer used as a channel, a source electrode and a drain electrode which are portions of the data line, and a gate insulating layer.

Figure 1:
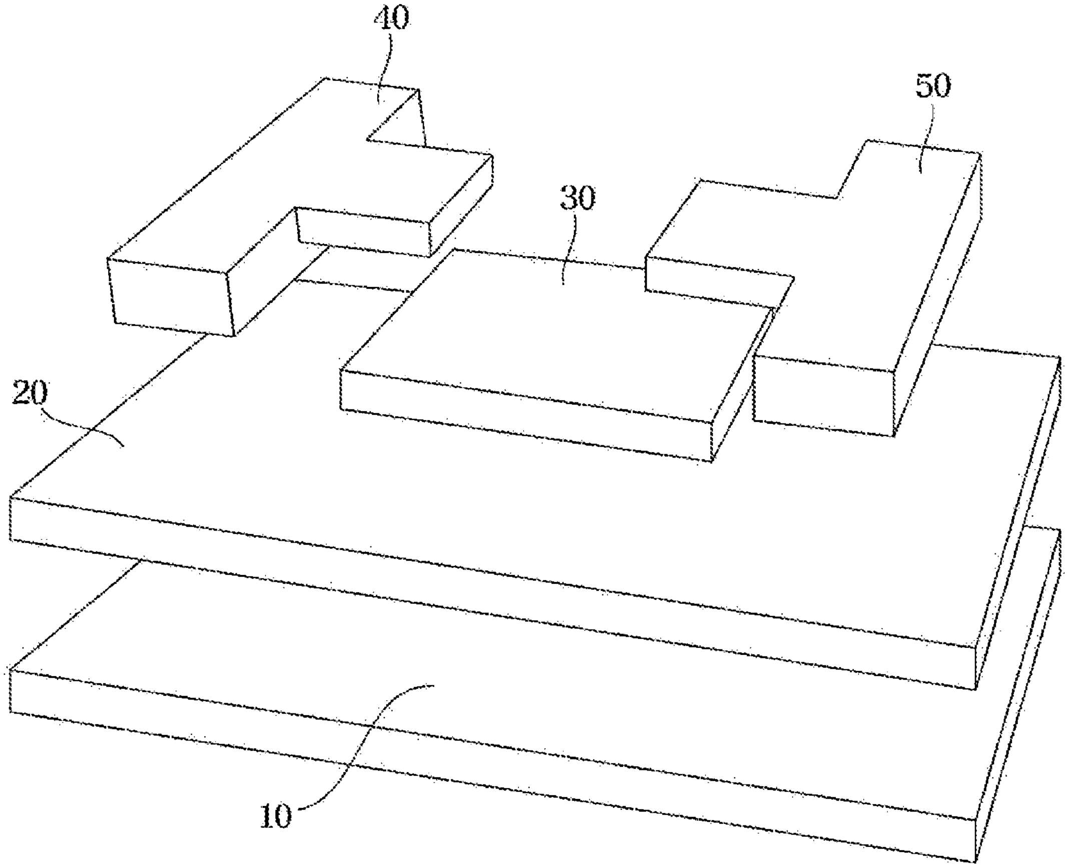
FIG. 1 (PRIOR ART)
FIG. 1 is a conceptual diagram of a thin film transistor including a single channel layer according to a prior art.

FIG. 1 illustrates a structure of a general TFT according to a prior art.

The TFT includes a substrate 10, an insulating layer 20 formed on the substrate 10, an active layer 30 formed on the insulating layer 20, and a source electrode 40 and a drain electrode 50 which are formed to be spaced apart from each other on the active layer 30.

As the substrate 10, a transparent substrate may be used. For example, a silicon substrate, a glass substrate, or a plastic substrate (polyethylene (PE), polyether sulfone (PES), polyethylene terephthalate (PET), polyethylene naphthalate (PEN), or the like) for implementing a flexible display may be used.

In addition, as the substrate 10, a reflective substrate may be used, and for example, a metal substrate may be used. The metal substrate may be made of stainless steel, titanium (Ti), molybdenum (Mo), or an alloy thereof.

The substrate 10 may serve as a gate electrode, or a gate electrode may be separately provided on the substrate.

For example, the gate electrode (not shown) may be positioned on the substrate 10. The gate electrode may be formed using a conductive material. For example, I gate electrode may be made of at least one metal selected from aluminum (Al), neodymium (Nd), silver (Ag), chromium (Cr), titanium (Ti), tantalum (Ta), molybdenum (Mo), and copper (Cu), or an alloy thereof.

The gate insulating layer 20 is formed on the substrate 10 or the gate electrode. The gate insulating layer 20 may be formed using at least one insulating material of inorganic insulating films including silicon oxide ($SiO_2$), silicon nitride (SiN), alumina ($Al_2O_3$), and zirconia ($ZrO_2$) with excellent adhesion to metal materials and excellent dielectric strength The active layer 30 is positioned on the gate insulating layer 20. The active layer 30 serves as a channel between the gate electrode and the source/drain electrode and has been mainly formed using amorphous silicon or crystalline silicon in the past.

However, since a glass substrate should be used as a TFT substrate using silicon, the TFT substrate is not only heavy but also rigid and thus cannot be used for a flexible display device. In order to solve such a disadvantage, a lot of research on new metal oxides is being conducted. In addition, in order to implement a high-speed device, that is, to improve mobility, it is preferable that a crystalline thin film having a high carrier concentration and excellent electrical conductivity is applied to the active layer.

Meanwhile, the source electrode 40 and the drain electrode 50 are formed on the active layer 30 to be spaced apart from each other. The source electrode 40 and the drain electrode 50 may be formed through the same process using the same material and may be made of conductive materials, for example, at least one metal selected from aluminum (Al), neodymium (Nd), silver (Ag), chromium (Cr), titanium (Ti), tantalum (Ta), and molybdenum (Mo) or an alloy thereof. In addition, the source electrode 40 and the drain electrode 50 may be formed not only as a single layer but also as a multi-layer including a plurality of metal layers.

In the present invention, the active layer 30 is formed as a metal oxide semiconductor layer having a heterojunction structure, and a TFT with considerably improved electron mobility is provided by overcoming low mobility, which is a limitation of an existing indium gallium zinc oxide (IGZO)-based semiconductor device.

Figure 2:
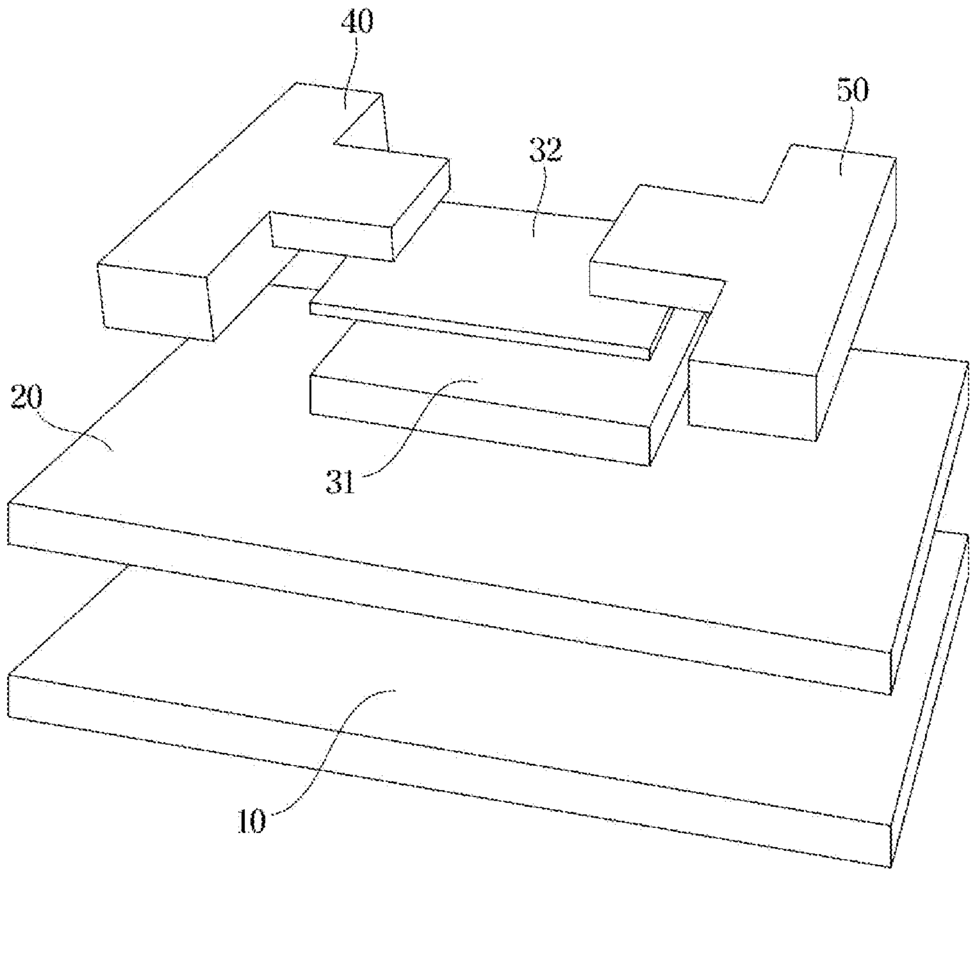
FIG. 2 is a conceptual diagram illustrating a thin film transistor including a two-layered channel layer according to one embodiment of the present invention.

FIG. 2 is a conceptual diagram illustrating a TFT according to one embodiment of the present invention.

The TFT according to the present invention includes a substrate 10, an insulating layer 20 formed on the substrate 10, an active layer 30 formed on the insulating layer 20, and a source electrode 40 and a drain electrode 50 which are formed on the active layer 30 to be spaced apart from each other, wherein the active layer 30 includes a first oxide semiconductor layer 31 and a second oxide semiconductor layer 32.

In the present invention, it is preferable that the first and second oxide semiconductor layers include In, Ga, Zn, and O as constituent elements.

In particular, the first oxide semiconductor layer preferably consists of In, Ga, and O, and the second oxide semiconductor layer preferably consists of Zn and O.

In one embodiment of the present invention, the first oxide semiconductor layer may include a compound represented by $In_{1-x}Ga_xO_{1.5}$.

Also, in one embodiment of the present invention, the second oxide semiconductor layer may include ZnO.

In the present embodiment, when an IGO-based oxide semiconductor layer of $In_{1-x}Ga_xO_{1.5}$ is provided as the first oxide semiconductor layer in contact with the insulating layer and is used as a front channel, and a ZnO layer is provided as the second oxide semiconductor layer, which is stacked on the first oxide semiconductor layer and is in contact with the source and gate electrodes, and is used as a back channel, it has been confirmed that a TFT having considerably improved electron mobility can be provided.

In one embodiment of the present invention, when the ZnO layer is used in a junction with the IGO-based semiconductor layer, it has been confirmed that, as compared with use of an IGO single layer as an active layer, considerably high electron mobility can be exhibited, a threshold voltage ($V_{TH}$), lower-threshold gate swing (SS), and an $I_{ON/OFF}$ ratio can all be considerably improved.

The first oxide semiconductor layer is preferably an IGO-based oxide semiconductor layer of $In_{1-x}Ga_xO_{1.5}$, and in $In_{1-x}Ga_xO_{1.5}$, x is preferably 0.1 or more and 0.3 or less. In one embodiment of the present invention, it has been confirmed that the characteristics of a transistor vary considerably depending on an In fraction in the composition of the IGO-based oxide semiconductor layer. It has been confirmed that, when a ratio of In is 0.70 or more (that is, when x is 0.30 or less), a synergistic effect can be exhibited in case that the IGO-based semiconductor layer forms a junction with the ZnO layer. In particular, when the ratio of In is 0.80 or more (that is, when x is 0.20 or less), crystallinity can be improved, and a synergistic effect with the ZnO layer can be further increased. However, when x is too low and thus a content of Ga is insufficient, swing characteristics and stability of a threshold voltage may be insufficient.

In the present invention, an improvement in characteristics due to the junction between the ZnO layer and an IGO layer is caused by an electron confinement phenomenon due to a bandgap difference between the ZnO layer and the IGO layer. That is, as the bandgap difference between the ZnO layer and the IGO layer increases, a transistor having better characteristics can be manufactured.

In one embodiment of the present invention, it has been confirmed that, as an In fraction in an IGO oxide layer increases, a bandgap value decreases, and as the ZnO layer becomes thinner, a bandgap value increases. Therefore, in order to increase the bandgap difference between the IGO layer and the ZnO layer, an In fraction in the IGO semiconductor layer should be high, and a thickness of the ZnO layer should be thin.

From this point of view, the second oxide semiconductor layer has preferably a thickness of 5 nm or less and more preferably a thickness of 3 nm or less. In addition, since it is difficult to form uniform coating when a thickness is 1 nm or less, the second oxide semiconductor layer has preferably a thickness of 1 nm to 5 nm and more preferably a thickness of 1.5 nm to 3 nm.

Meanwhile, the first oxide semiconductor layer has preferably a thickness of 8 nm to 30 nm and more preferably a thickness of 10 nm to 20 nm. When the first oxide semiconductor layer is too thin, it is difficult for the first oxide semiconductor layer to have a sufficient electron concentration, and thus it is difficult for the first oxide semiconductor layer to serve as a channel. When the first oxide semiconductor layer is excessively thick, swing characteristics may be degraded.

A TFT of the present invention including an active layer having a ZnO/IGO heterojunction structure may exhibit an electron mobility of 60 $cm^2/Vs$ or more. In one embodiment of the present invention, it has been confirmed that a TFT including an active layer having a heterojunction structure can exhibit an electron mobility of up to about 63.2 $cm^2/Vs$.

A TFT according to one embodiment of the present invention may be manufactured through a method comprising: providing a substrate; forming an insulating layer on the substrate, forming a first oxide semiconductor layer on the insulating layer; forming a second oxide semiconductor layer on the first oxide semiconductor layer; and forming a source electrode and a drain electrode to be spaced apart from each other on the second oxide semiconductor layer.

In the present invention, the first and second oxide semiconductor layers are preferably formed through an atomic layer deposition (ALD) process.

The ALD process may be performed on an oxide semiconductor layer including In, Ga, Zn, and O as constituent elements using an indium source, a gallium source, a zinc source, and an oxidation source. A nitrogen gas may be used as a carrier gas to transfer a precursor source gas.

As the indium source, for example, trimethyl indium ($In(CH_3)_3$) (TMIn) or the like may be used. The indium source is preferably stored at a temperature of 70° C. to 90° C. to provide sufficient vapor pressure and capacity.

As the gallium source, for example, trimethyl gallium ($Ga(CH_3)_3$) (TMGa) or the like may be used.

In addition, as the zinc source, diethyl zinc ($Zn(C_2H_5)_2$) (DEZ), dimethyl zinc ($Zn(CH_3)_2$) (DMZ), or the like may be used.

Also, as the oxidation source, for example, at least one of oxygen ($O_2$), ozone ($O_3$), water vapor ($H_2O$), $N_2O$, and $CO_2$ may be used.

When an active layer is formed using an ALD process, supply of a source material may be adjusted to control physical factors such as the composition and thickness of an oxide semiconductor layer. In particular, an IGO oxide semiconductor layer in which a fraction of indium is 0.7 or more (that is, x is 0.3 or less) may be controlled and formed by adjusting supply of the indium and gallium sources. In addition, a thickness of a ZnO layer may also be controlled by controlling supply of the zinc source.

In a method for manufacturing the TFT of the present invention, first, a $SiO_2$ layer (gate insulator) having a thickness of about 100 nm may be grown on a substrate such as a heavily doped p-type Si wafer through a thermal oxidation process.

Next, the first oxide semiconductor layer adjacent to a gate insulating layer is formed through an ALD process. Since the first oxide semiconductor layer formed through the ALD process has excellent film quality and interfacial characteristics, the first oxide semiconductor layer may be used as a front channel that is important for channel formation.

That is, when a positive voltage is applied to the gate electrode, negative (−) charges are accumulated on a portion of the active layer on the gate insulating layer to form a front channel, and as a current flows well through the front channel, mobility increases. Therefore, it is preferred that a front channel region is formed of a material having excellent mobility.

In addition, the second oxide semiconductor layer may be formed on the first oxide semiconductor layer through an ALD process to be used as a back channel. That is, when a negative (−) voltage is applied to the gate electrode, negative (−) charges are accumulated on a portion of the active layer below the source and drain electrodes. Therefore, it is preferred that the back channel is formed to have the composition capable of preventing charge transfer, that is, to have conductivity which is lower than that of the first active layer serving as the front channel.

In the present invention, an inflow rate of at least one of the indium source, the gallium source, and the zinc source may be adjusted in the ALD process to control a composition and thickness of the first and second oxide semiconductors to be manufactured. For example, the number of subcycles of the indium and gallium sources may be adjusted to form an IGO-based oxide semiconductor layer having a high indium fraction. Alternatively, the zinc source may be adjusted to control the thickness of the ZnO layer.

In addition, in order to deposit the oxide semiconductor layer, deposition may be performed in a state in which a temperature of the substrate is maintained in a range of 200° C. to 300° C. This is because self-limiting behaviors of heterocomponents of $In_2O_3$, $Ga_2O_3$, and ZnO films coexist at a substrate temperature of 250° C. Therefore, it is more preferable that the temperature of the substrate is maintained in a range of 230° C. to 270° C. for depositing the oxide semiconductor layer.

The first and second oxide semiconductor layers deposited through the ALD method may be patterned using standard photolithography, wet etching, or the like as necessary.

After the active layer is formed, an indium tin oxide (ITO) thin film may be mainly deposited as a source/drain (S/D) electrode using a sputtering system and may be patterned using a lift-off method.

The manufactured transistor was subjected to post-deposition annealing (PDA) at a temperature of 300° C. to 500° C. and preferably at a temperature of about 400° C. for 1 hour in an air atmosphere.

In one embodiment of the present invention, it has been confirmed that a ZnO layer reduces surface roughness of an IGO layer when a PDA process is performed on a ZnO/IGO heterojunction channel layer.

In the TFT manufactured through a method of the present invention, electron mobility can be excellent, and a threshold voltage ($V_{TH}$), lower-threshold gate swing (SS), an $I_{ON/OFF}$ ratio, or the like can also be considerably improved as compared to a conventional IGZO-based transistor, and thus TFT has excellent utility in the display field.

EXAMPLES

Hereinafter, the present invention will be described in more detail through examples. These examples are for illustrative purposes only, and it will be apparent to those of ordinary skill in the related art that the scope of the present invention is not construed as being limited by these examples.

Manufacturing Example: Manufacturing of Oxide Semiconductor TFT

An IGZO-based metal oxide TFT having a bottom gate structure was manufactured.

A 100 nm thick $SiO_2$ layer (gate insulator) was grown on a heavily doped p-type Si wafer as a gate electrode through thermal oxidation.

An oxide channel layer was deposited through an ALD method and patterned using standard photolithography and wet etching processes.

The oxide channel layer was deposited on the insulating layer using a traveling wave ALD device (manufactured by CN1 Co., Ltd.). A liquid In, Ga, and Zn metal precursors were injected directly into a source line, and here, a nitrogen gas with a flow rate of 50 sccm per minute was used as a carrier gas for precursor transfer. A canister containing the In precursor was maintained at a temperature of 80° C. to provide sufficient vapor pressure and capacity, and canisters containing the Ga and Zn precursors were maintained at room temperature due to sufficient vapor pressure. Ozone ($O_3$) was used as an oxidizing agent. A gas mixture including 970 sccm of $O_2$ and 30 sccm of $N_2$ was introduced into an $O_3$ generator to produce an $O_3$ gas at a concentration of 250 g/m$^3$.

In this case, the number of subcycles of a cation metal oxide was adjusted such that target oxide channel layers having different cation compositions were deposited. A rather long purge time (10 seconds for each metal precursor and $O_3$ purge) was used to prevent undesired mixing between the precursors and reactants, and since self-limiting behaviors of heterogeneous components of $In_2O_3$, $Ga_2O_3$, and ZnO films coexisted at a substrate temperature of 250° C., a substrate temperature for oxide channel film deposition was maintained at 250° C.

A heterojunction channel structure including a 10 nm thick IGO film and a 3 nm thick ZnO film was formed as a carrier transport layer. In this case, the IGO film was divided into three different compositions of $In_{0.65}Ga_{0.35}O_{1.5}$, $In_{0.75}Ga_{0.25}O_{1.5}$, and $In_{0.83}Ga_{0.17}O_{1.5}$.

For comparison, a single IGO channel layer with the same cationic composition was also deposited. A physical thickness of all IGO layers was designed to be about 10 nm.

A width W and a length L of a channel were 40 μm and 20 μm, respectively.

After the channel layer was formed, a 100 nm thick ITO film was deposited as a source/drain (S/D) electrode using a DC sputtering system and patterned using a lift-off method.

The manufactured transistor was subjected to post-deposition annealing (PDA) at a temperature of 400° C. for 1 hour in an air atmosphere.

Experiment Method

A chemical composition of the IGO and ZnO films was determined through X-ray fluorescence spectroscopy (XRF, ZSX Primus II manufactured by Rigaku Corporation), and an atomic concentration was corrected through proton-induced X-ray emission.

A crystal structure of the semiconductor oxide film was analyzed using grazing incident X-ray diffraction (GIXRD) with CuKα radiation (40 kV, 30 mA) (X'Pert PRO, PANalytical) and using high-resolution electron microscopy (HR-TEM, ecnai F20: FEI).

A chemical state of the metal oxide film was analyzed through X-ray photoelectron spectroscopy (XPS, K-Alpha+ manufactured by Thermo Fisher Scientific Co.).

Surface morphology and roughness of the semiconductor oxide film were observed with an atomic force microscope (AFM, XE-100 manufactured by Park Systems Co.) in a non-contact mode.

A film thickness and a band gap were measured using spectroscopic ellipsometry (SE, Elli-SE manufactured by Ellipso Technology Co.)

A mass density of the deposited semiconductor film was analyzed through high-resolution X-ray reflectometry (XRR, PANalytical, X'pert Pro), and here, data was approximated using a Philips WinGixa software package.

The electrical characteristics of the transistor were measured at room temperature in a dark ambient condition using a Keithley 4200-SCS semiconductor analyzer system.

A field-effect mobility value ($\mu_{FE}$) was determined by analyzing maximum transconductance at a drain voltage ($V_{DS}$) of 0.1 V.

A threshold voltage ($V_{TH}$) was determined by a gate voltage ($V_{GS}$) which induces a drain current of L/W×10 nA at a $V_{DS}$ of 5.1 V (L represents a channel length and W represents a channel width).

Lower-threshold gate swing ($SS=dV_{GS}/d \log I_{DS}$ [V/decade]) was extracted from a linear portion of $\log(I_{DS})$ versus $V_{GS}$ plot.

The number of fast bulk traps ($N_T$) and semiconductor-insulator interface traps ($D_{it}$) was calculated using Equation below.

$$SS = \frac{qk_BT(N_Tt_{ch} + D_{it})}{C_i\log(e)}$$

(Where q denotes electron charges, $k_B$ is the Boltzmann constant, T is an absolute temperature, and $t_{ch}$ denotes a total channel layer thickness)

$N_T$ and $D_{it}$ in a transistor were calculated by setting one of the parameters to zero. Therefore, $N_T$ and $D_{it}$ values can be interpreted as a maximum trap density formed in a given system.

Figure 3A:
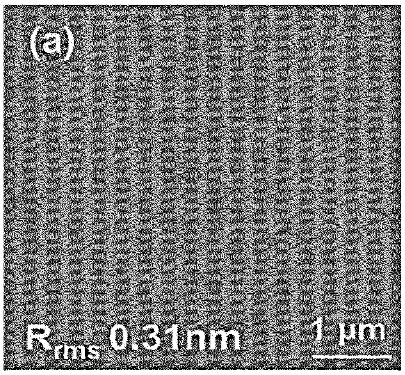
FIG. 3A is an image for $In_{0.65}Ga_{0.35}O_{1.5}$.
Figure 3B:
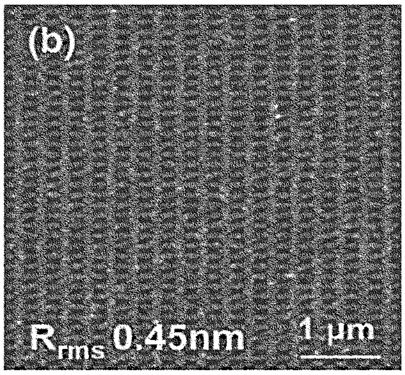
FIG. 3B is an image for $In_{0.75}Ga_{0.25}O_{1.5}$.
Figure 3C:
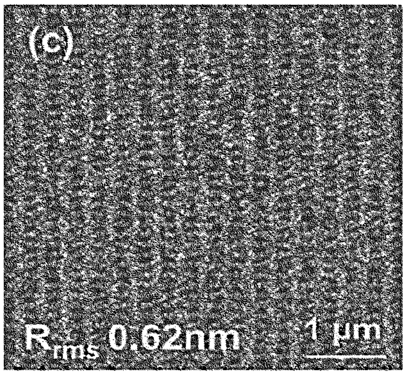
FIG. 3C is an image for $In_{0.83}Ga_{0.17}O_{1.5}$.
Figure 3D:
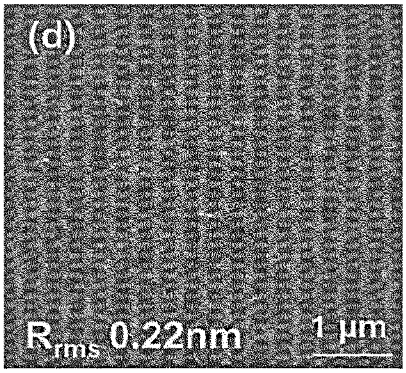
FIG. 3D is an image for $ZnO/In_{0.65}Ga_{0.35}O_{1.5}$.
Figure 3E:
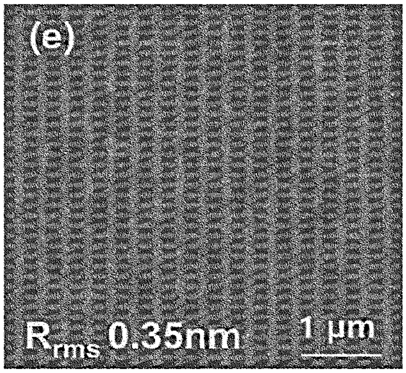
FIG. 3E is an image for $ZnO/In_{0.75}Ga_{0.25}O_{1.5}$.
Figure 3F:
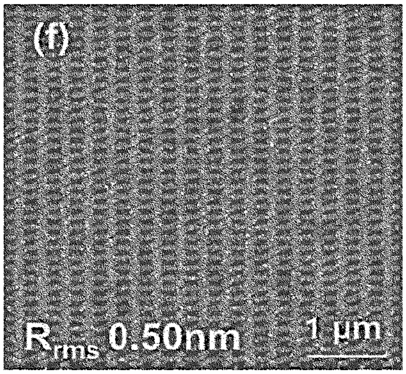
FIG. 3F is an image for $ZnO/In_{0.83}Ga_{0.17}O_{1.5}$.

Experimental Example 1: Analysis of Surface Characteristics of Oxide Semiconductor Layer 1-1. AFM Image Analysis FIG. 3 shows AFM topographic images of IGO and ZnO/IGO films with different In fractions after PDA at a temperature of 400° C. All scan areas in FIG. 3 were set to have a size of 5 μm×5 μm. FIG. 3A is an image for $In_{0.65}Ga_{0.35}O_{1.5}$, FIG. 3B is an image for $In_{0.75}Ga_{0.25}O_{1.5}$, FIG. 3C is an image for $In_{0.83}Ga_{0.17}O_{1.5}$, FIG. 3D is an image for ZnO/$In_{0.65}Ga_{0.35}O_{1.5}$, FIG. 3E is an image for ZnO/$In_{0.75}Ga_{0.25}O_{1.5}$, and FIG. 3F is an image for ZnO/$In_{0.83}Ga_{0.17}O_{1.5}$.

In FIG. 3A, the $In_{0.65}Ga_{0.35}O_{1.5}$ film was smooth without any special topography, and root mean square (RMS) roughness for a scan area of 5 μm×5 μm was 0.31 nm.

However, the $In_{0.83}Ga_{0.17}O_{1.5}$ film with the highest In fraction was rougher and exhibited an RMS roughness of about 0.63 nm.

On the other hand, it was confirmed that surface roughness of the ZnO/IGO stack was improved.

RMS roughness values of the ZnO/$In_{0.65}Ga_{0.35}O_{1.5}$ and ZnO/$In_{0.83}Ga_{0.17}O_{1.5}$ materials decreased to 0.22 nm and 0.50 nm, respectively.

Therefore, it was confirmed that a ZnO capping layer could alleviate roughness of a film during a PDA process at a temperature of 400° C.

1-2. XRD Analysis

To investigate topological changes of the IGZO film in more detail, structural characteristics of the IGO and ZnO/IGO films were analyzed through XRD.

FIG. 4 shows XRD patterns of IGO and ZnO/IGO films with different In fractions after PDA at a temperature of 400° C.

In FIG. 4, the $In_{0.65}Ga_{0.3401.5}$ and $In_{0.83}Ga_{0.17}O_{1.5}$ films had no distinct peaks indicating amorphous characteristics, and peaks near 51.7° and 55.7° were caused by (321) and (400) reflections of a Si substrate, respectively (which were also observed on a $SiO_2$/Si substrate without a IGO film).

On the other hand, the $In_{0.83}Ga_{0.17}O_{1.5}$ film with the highest In fraction had two peaks at 31.0° and 35.8°, and the two peaks corresponded to (222) and (400) reflections of a bixbyite $In_{1-x}Ga_xO_{1.5}$ crystal, respectively.

(222) and (400) reflections of the $In_2O_3$ crystal were confirmed at 30.6° and 35.5°, respectively.

The ZnO/IGO heterojunction layer also showed a crystallization tendency dependent on an In fraction similar to that of an IGO single layer. In the heterojunction layer, only the ZnO/$In_{0.83}Ga_{0.17}O_{1.5}$ film had a polycrystalline structure (see FIG. 3F).

Peak intensity of (222) reflection with respect to the ZnO/$In_{0.83}Ga_{0.17}O_{1.5}$ film was slightly reduced as compared with that of the $In_{0.83}Ga_{0.17}O_{1.5}$ film. Presumably, the presence of the 3 nm thick ZnO layer on the $In_{0.83}Ga_{0.17}O_{1.5}$ film might relieve a conversion rate to reduce an RMS roughness value to 0.50 nm.

1-3. HRTEM Analysis

A cross-sectional image of the ZnO/$In_{0.83}Ga_{0.17}O_{1.5}$ heterojunction stack was analyzed through HRTEM and shown in FIG. 5.

An energy dispersive spectroscopy (EDS) map for the given sample obtained through scanning transmission electron microscope (TEM) analysis clearly shows that Zn and In/Ga cations are respectively divided into 3 nm thick ZnO and 10 nm thick IGO to form a ZnO/IGO heterojunction stack.

Experimental Example 2: Analysis of Electron Transport Characteristics of TFT

Transmission characteristics of the transistor including the IGO single channel layer and the transistor including the ZnO/IGO heterojunction channel layer were analyzed and shown in FIG. 6 and Table 1. FIG. 6A is an image for $In_{0.65}Ga_{0.35}O_{1.5}$, FIG. 6B is an image for $In_{0.75}Ga_{0.25}O_{1.5}$, FIG. 6C is an image for $In_{0.83}Ga_{0.17}O_{1.5}$, FIG. 6D is an image for ZnO/$In_{0.65}Ga_{0.35}O_{1.5}$, FIG. 6E is an image for ZnO/$In_{0.75}Ga_{0.25}O_{1.5}$, and FIG. 6F is an image for ZnO/$In_{0.83}Ga_{0.17}O_{1.5}$.

TABLE 1

| Sample | $\mu_{FE}$ ($cm^2$/Vs) | SS (V/decade) | $V_{TH}$ (V) | $I_{ON/OFF}$ | $N_{T,MAX}$ ($cm^{-3}eV^{-1}$) |
|---|---|---|---|---|---|
| $In_{0.65}Ga_{0.35}O_{1.5}$ | 24.5 ± 0.72 | 0.28 ± 0.05 | −0.27 ± 0.58 | $5 \times 10^7$ | $1.01 \times 10^{18}$ |
| $In_{0.75}Ga_{0.25}O_{1.5}$ | 34.7 ± 1.51 | 0.43 ± 0.02 | −1.34 ± 0.52 | $2 \times 10^7$ | $1.55 \times 10^{18}$ |
| $In_{0.83}Ga_{0.17}O_{1.5}$ | 41.7 ± 1.43 | 0.44 ± 0.07 | −1.55 ± 0.71 | $1 \times 10^8$ | $1.45 \times 10^{18}$ |
| ZnO/$In_{0.65}Ga_{0.35}O_{1.5}$ | 24.8 ± 0.83 | 0.35 ± 0.07 | −1.23 ± 0.36 | $3 \times 10^7$ | $9.73 \times 10^{17}$ |
| ZnO/$In_{0.75}Ga_{0.25}O_{1.5}$ | 44.6 ± 0.86 | 0.38 ± 0.11 | −1.00 ± 0.57 | $9 \times 10^7$ | $1.06 \times 10^{18}$ |
| ZnO/$In_{0.83}Ga_{0.17}O_{1.5}$ | 63.2 ± 0.26 | 0.26 ± 0.03 | −0.84 ± 0.85 | $9 \times 10^8$ | $7.23 \times 10^{17}$ |

From the above table, it can be seen that, as a fraction of In increases, carrier mobility increases. As the In fraction increases, carrier mobility of the transistor including the ZnO/IGO heterojunction channel increases more considerably to have a maximum value of 63.2 $cm^2$/Vs.

In addition, it can be confirmed that, in the transistors having including heterojunction channel layers of ZnO/$In_{0.75}Ga_{0.25}O_{1.5}$ and ZnO/$In_{0.83}Ga_{0.17}O_{1.5}$, respectively, all of SS, $V_{TH}$, and $I_{ON/OFF}$ values were improved as compared with the transistor including the single channel layer with the same In/Ga composition.

That is, it can be seen that an unfavorable gap state distribution can be reduced by adopting a heterojunction structure. Such improved carrier transport characteristics may be reflected in the output characteristics of a transistor.

However, in the case of a channel layer having a low fraction of In, it can be seen that a synergistic effect by ZnO was hardly shown.

Experimental Example 3: Analysis of Optical Characteristics of IGO and ZnO Channel Layers Optical properties such as transmittance and band gap ($E_g^{opt}$) of IGO and ZnO thin films were examined and shown in FIGS. 7 to 10.

Figure 7:
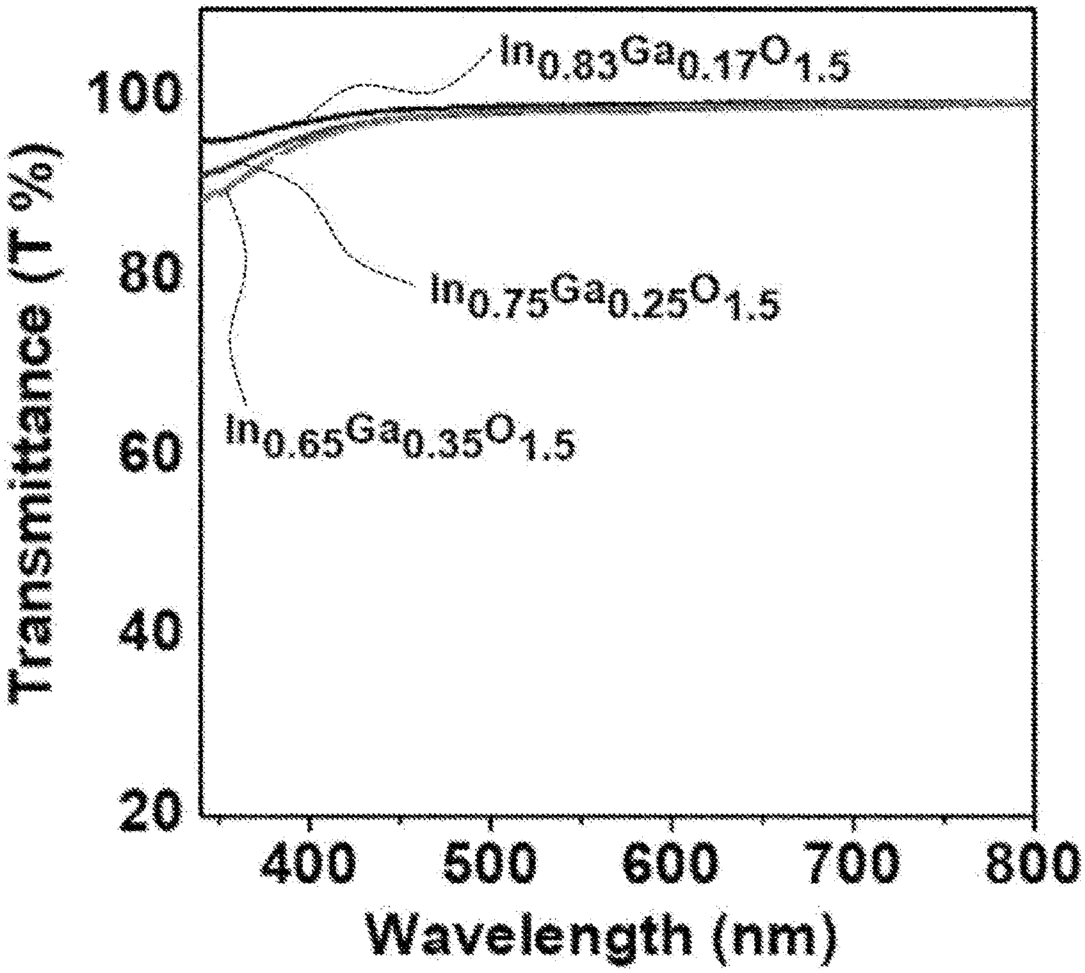
FIG. 7 is a graph showing visible light transmittance of an IGO film.
Figure 8:
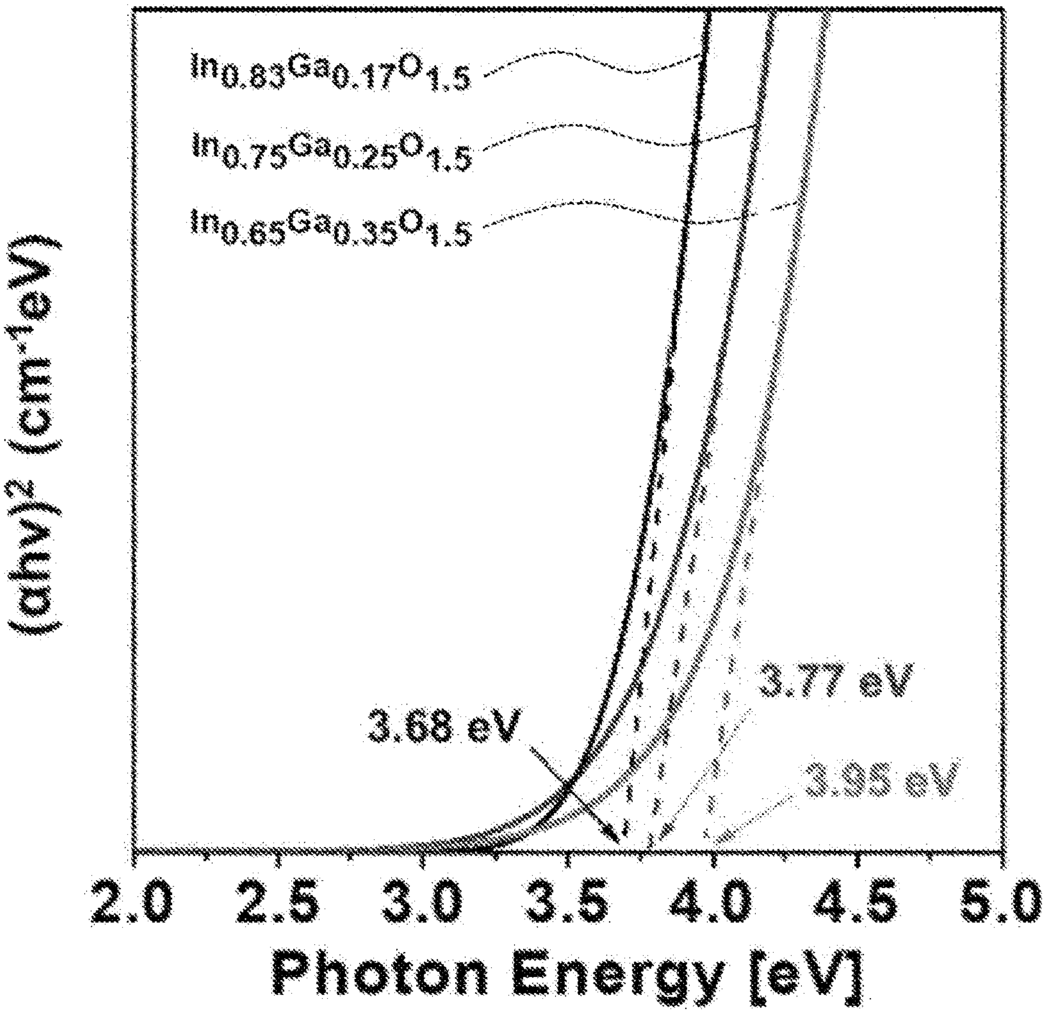
FIG. 8 is a graph showing a bandgap of an IGO film.
Figure 9:
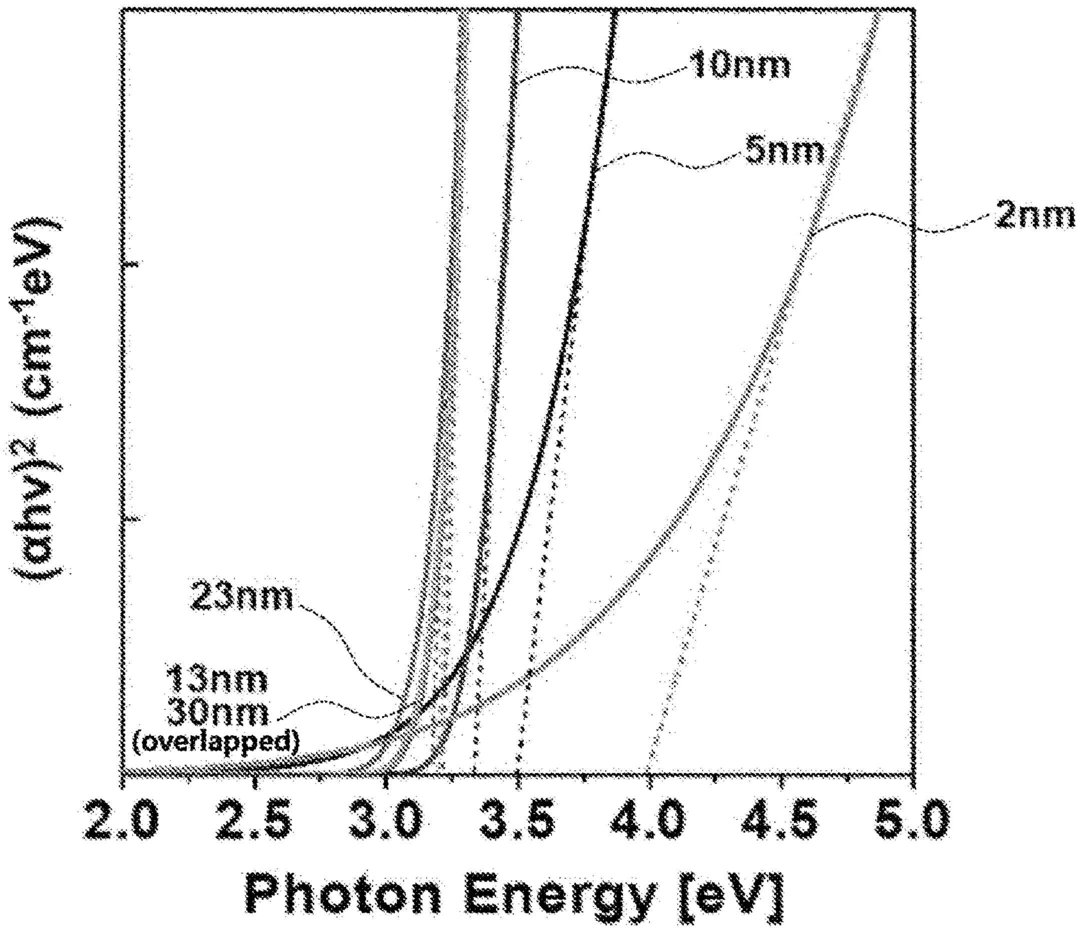
FIGS. 9 and 10 are graphs showing changes in band value according to a ZnO film thickness.
Figure 10:
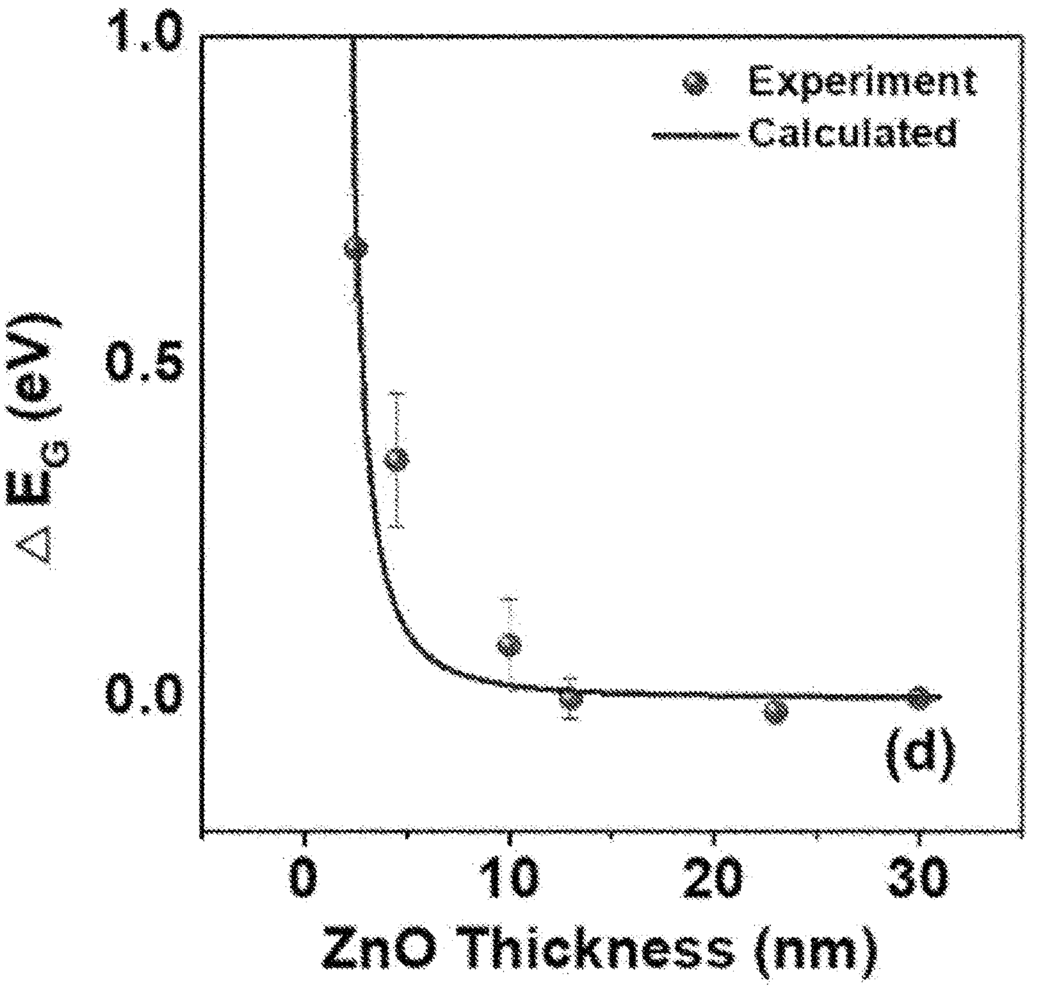

FIG. 7 is a graph showing a visible light transmittance of IGO films, and FIG. 8 is a graph showing a band gap of the IGO films. FIGS. 9 and 10 are graphs showing changes in band value according to a ZnO film thickness.

In FIG. 7, it was confirmed that all IGO films exhibited an average transmittance of more than 90% in a visible light region to be optically transparent and colorless.

In FIG. 8, the bandgap ($E_g^{opt}$) value of the IGO film was determined by estimating a best suitable line in a plot of $(\alpha h\nu)^2$ versus hν at an intercept of $\alpha=0$.

In FIG. 8, as a fraction of In increased, an $E_g^{opt}$ value considerably decreased from 3.95 eV to 3.68 eV.

In the case of the ZnO film, in FIG. 9, an $E_g^{opt}$ value gradually increased as a film thickness decreased.

When a thickness of the ZnO film was about 15 nm, a $E_g^{opt}$ value was about 3.30 eV as reported in the literature, but the $E_g^{opt}$ value of the ZnO film with a thickness of 3 nm increased considerably to about 3.98 eV.

This seems to be due to an energy quantization effect derived from an infinite quantum well model.

As shown in FIG. 10, in a change in band gap as a function of ZnO thickness, a band gap increases considerably as a thickness decreases.

In addition, ZnO (3 nm)/$In_{0.65}Ga_{0.35}O_{1.5}$ is not effective for carrier confinement because ZnO and IGO have similar $E_g$ values (3.95 eV to 3.98 eV). Therefore, as can be seen in Table 1, a mobility value of a transistor is relatively small.

Experimental Example 4: Analysis of Band Gap Characteristics

In order to confirm a spatial energy band structure of the $In_{0.83}Ga_{0.17}O_{1.5}$ single layer film and the ZnO/$In_{0.83}Ga_{0.17}O_{1.5}$ heterojunction layer film, ultraviolet photoelectron spectroscopy (UPS) depth profile analysis was performed and shown in FIG. 11.

FIG. 11A shows a valance band (VB) spectrum according to a depth of the $In_{0.83}Ga_{0.17}O_{1.5}$ single layer film, and FIG. 11B shows a VB spectrum according to a depth of the ZnO/$In_{0.83}Ga_{0.17}O_{1.5}$ heterojunction layer film.

FIG. 11A shows an UPS depth profile for the $In_{0.83}Ga_{0.17}O_{1.5}$ single layer film. An energy position of a VB edge did not change according to an etching time, which meant that there was no band bending of the $In_{0.83}Ga_{0.17}O_{1.5}$ channel layer.

Meanwhile, in FIG. 11B, as an etching section moved from a ZnO area to an $In_{0.83}Ga_{0.17}O_{1.5}$ area, an energy position of a VB edge monotonically decreased from 3.78 eV to 3.58 eV.

Information about a VB edge change according to a depth was shown in an energy band diagram of the ZnO/$In_{0.83}Ga_{0.17}O_{1.5}$ heterojunction stack together with $E_g$ values in FIG. 12.

From FIG. 12, it can be inferred that electron transfer from a ZnO layer to an $In_{0.83}Ga_{0.17}O_{1.5}$ layer leads to accumulation of free carriers near the $In_{0.83}Ga_{0.17}O_{1.5}$ layer with smaller $E_g$.

This is more effective because a ZnO barrier layer has an $E_g$ value of 3.98 eV that is much larger than $E_g$ of 3.67 eV of an IGO film. It is assumed that the formation of two-dimensional electron gas (2DEG) near the $In_{0.83}Ga_{0.17}O_{1.5}$ layer can abruptly increase mobility up to 63.2 $cm^2$/Vs.

Experimental Example 5: Analysis of Gate Bias Stress Stability

Heterojunction structures were additionally analyzed by examining gate bias stress stability of each transistors including the IGO single channel and the ZnO/IGO heterojunction channel.

FIGS. 13A and 13B show graphs showing a change in $V_{TH}$ shift in $I_{DS}$-$V_{GS}$ transmission characteristics of the transistors with the IGO channel and the ZnO/IGO heterojunction channel respectively under positive gate bias stress (PBS) and negative gate bias stress (NBS) conditions (up to 3,600 sec) in a stress function.

In the graphs of FIG. 13, S1 indicates $In_{0.65}Ga_{0.35}O_{1.5}$, S2 indicates $In_{0.75}Ga_{0.25}O_{1.5}$, S3 indicates $In_{0.83}Ga_{0.17}O_{1.5}$, S4 indicates ZnO/$In_{0.65}Ga_{0.35}O_{1.5}$, S5 indicates ZnO/$In_{0.75}Ga_{0.25}O_{1.5}$, and S6 indicates ZnO/$In_{0.83}Ga_{0.17}O_{1.5}$.

Both devices received stress at gate biases of +20 V (PBS) and −20 V (NBS).

In the case of the single-channel IGO transistor, a control device including the $In_{0.65}Ga_{0.35}O_{1.5}$ single layer exhibited $V_{TH}$ shifts ($\Delta V_{TH}$) of +0.57 V and −1.21 V for 3,600 seconds during PBS and NBS tests.

In FIG. 13A, PBS and NBS instability of the IGO transistor deteriorated as an In fraction increased. The device including the $In_{0.83}Ga_{0.17}O_{1.5}$ single channel exhibited a large positive $V_{TH}$ shift ($\Delta V_{TH}$=+1.96 V) and a large negative $V_{TH}$ shift ($\Delta V_{TH}$=−1.99 V) after the same test.

This is related to an increase in oxygen vacancy (VO) defect density in an IGO film according to a decrease in Ga fraction. When an In concentration increases, since a bond of In—O is weaker than that of Ga—O and VO formation energy is reduced, it is easier to create VO defects.

In an NBS test, a deep VO state allows free electron carriers to be released. Thus, a transistor with the highest In fraction (that is, 83%) exhibits the largest PBS- and NBS-induced $V_{TH}$ shift.

On the other hand, the transistor including the ZnO/$In_{1-x}Ga_xO_{1.5}$ (x=0.35, 0.25, or 0.17) heterojunction channel exhibited much more stable behavior than the device including the single IGO channel layer.

In particular, a $\Delta V_{TH}$ value of the transistor including the ZnO/$In_{0.83}Ga_{0.17}O_{1.5}$ heterojunction channel considerably decreased from +1.96 V and −1.99 V of the single channel to +0.58 V and −0.39 V after the same PBS and NBS tests.

That is, it was confirmed that the existence of an ultra-thin ZnO layer on an IGO channel layer suppressed $V_O$ defects to stabilize a device.

Although the present invention has been described in detail with reference to the specific features, it will be apparent to those skilled in the art that this description is only for an embodiment and does not limit the scope of the present invention. Thus, the substantial scope of the present invention will be defined by the appended claims and equivalents thereof.

The invention claimed is:

1. A thin film transistor comprising:
a substrate;
an insulating layer formed on the substrate;
an active layer formed on the insulating layer; and
a source electrode layer and a drain electrode layer which are formed on the active layer to be spaced apart from each other,
wherein the active layer comprises:
a first oxide semiconductor layer consisting of indium (In), gallium (Ga), and oxygen (O); and
a second oxide semiconductor layer formed on the first oxide semiconductor layer and consisting of zinc (Zn) and O,
wherein the first oxide semiconductor layer is represented by $In_{1-x}Ga_xO_{1.5}$, wherein x is 0.2 or less,
the second oxide semiconductor layer has a thickness of 1.5 nm to 3 nm, and
the first oxide semiconductor layer has a thickness of 10 nm to 20 nm.

2. The thin film transistor of claim 1, wherein the thin film transistor has an electron mobility of 60 $cm^2$/Vs or more.

3. A method for manufacturing a thin film transistor, the method comprising:
providing a substrate;
forming an insulating layer on the substrate;
forming a first oxide semiconductor layer consisting of indium (In), gallium (Ga), and oxygen (O) on the insulating layer;
forming a second oxide semiconductor layer consisting of zinc (Zn) and O on the first oxide semiconductor layer; and
forming a source electrode and a drain electrode to be spaced apart from each other on the second oxide semiconductor layer,
wherein the first oxide semiconductor layer is represented by $In_{1-x}Ga_xO_{1.5}$, wherein x is 0.2 or less,
the second oxide semiconductor layer has a thickness of 1.5 nm to 3 nm, and the first oxide semiconductor layer has a thickness of 10 nm to 20 nm.

4. The method of claim 3, wherein at least one of the first and second oxide semiconductors is formed through atomic layer deposition (ALD).

5. The method of claim 4, wherein a temperature of the substrate is maintained in a range of 200° C. to 300° C. during the process of the ALD.

6. The method of claim 4, wherein, during the process of the ALD, an inflow rate of at least one of an indium source, a gallium source, and a zinc source is adjusted to control a composition and thickness of the oxide semiconductor layer to be manufactured.

7. The method of claim 4, further comprising: performing post-processing at a temperature of 300° C. to 500° C. after the process of the ALD.

8. A display device comprising the thin film transistor of claim 1.

* * * * *